United States Patent
Hung et al.

(10) Patent No.: US 7,241,659 B2
(45) Date of Patent: Jul. 10, 2007

(54) VOLATILE MEMORY DEVICES AND METHODS FOR FORMING SAME

(75) Inventors: Chin-Long Hung, Hsinchu (TW); Hong-Long Chang, Hsinchu (TW); Yueh-Chuan Lee, Nantou County (TW)

(73) Assignee: Promos Technologies, Inc., Hsinchu (TW)

( * ) Notice: Subject to any disclaimer, the term of this patent is extended or adjusted under 35 U.S.C. 154(b) by 175 days.

(21) Appl. No.: 10/983,664

(22) Filed: Nov. 9, 2004

(65) Prior Publication Data

US 2005/0067648 A1    Mar. 31, 2005

Related U.S. Application Data

(63) Continuation-in-part of application No. 10/669,346, filed on Sep. 25, 2003, now Pat. No. 6,987,044.

(30) Foreign Application Priority Data

Sep. 15, 2004    (TW) .............................. 93127848 A

(51) Int. Cl.
*H01L 21/8242*    (2006.01)

(52) U.S. Cl. ...................... 438/242; 438/243; 438/244; 438/245; 438/246

(58) Field of Classification Search ........ 257/244–253; 438/242, 243, 244, 245, 246, 247, 248, 249, 438/250, 251, 252, 253
See application file for complete search history.

(56) References Cited

U.S. PATENT DOCUMENTS 5,736,760 A * 4/1998 Hieda et al. ................. 257/301
6,987,044 B2 * 1/2006 Chen et al. .................. 438/243

* cited by examiner

*Primary Examiner*—Sara Crane
*Assistant Examiner*—Samuel A. Gebremariam
(74) *Attorney, Agent, or Firm*—Birch, Stewart, Kolasch & Birch, LLP

(57) ABSTRACT

A method for forming a volatile memory device. A substrate comprising a pair of neighboring trenches is provided, each trench comprising a capacitor. A collar insulating layer is formed on an upper sidewall of each trench. The collar insulating layer comprises a low level portion and a high level portion adjacent to a predetermined active area of the volatile memory device.

5 Claims, 7 Drawing Sheets

VOLATILE MEMORY DEVICES AND METHODS FOR FORMING SAME

CROSS-REFERENCE TO RELATED APPLICATION

This application is a continuation-in-part (CIP) of U.S. application Ser. No. 10/669,346 filed on Sep. 25, 2003, now U.S. Pat. No. 6,987,044 which is hereby incorporated by reference.

BACKGROUND

The invention relates in general to memory devices, and more particularly, to volatile memory devices and methods for forming the same.

A dynamic random access memory (DRAM) device is a typical volatile memory device for integrated circuit devices. A DRAM cell includes an access transistor and a storage capacitor. A buried strap has been employed in fabricating deep trench-based DRAM devices. The buried strap is critical in connecting the storage capacitor to the access transistor. Accordingly, the resistivity of the buried strap and the buried strap width are important factors in providing superior interconnect properties between transistors and capacitors. The buried strap width is subject to the active area of the deep trench overlay.

FIG. 1 is a cross-section showing a conventional deep trench-based DRAM structure. The DRAM structure includes a substrate 100 having a plurality of pairs of neighboring trenches formed therein. A pair of neighboring trenches 101 is shown for simplicity. Two buried trench capacitors 105 are respectively disposed in a lower portion of each trench 101. The capacitor 105 includes a buried bottom plate 102 formed in the substrate 100 around the lower portion of the trench 101, a top plate 104 disposed in the lower portion of the trench 101, and a capacitor dielectric layer 103 disposed between the buried bottom plate 102 and the top plate 104. Two collar oxide layers 106 are respectively disposed over an upper portion of the sidewall of each trench 101, and two first conductive layers 108 are respectively disposed in the upper portion of each trench 101 and surrounded by the collar oxide layers 106. Two second conductive layers 110 are respectively disposed overlying the collar oxide layer 106 and the first conductive layer 108 in each trench 101. A shallow trench isolation (STI) structure 112 is disposed between the neighboring trenches 101 to serve as an isolation region between the buried trench capacitors 105. Access transistors 114 are disposed overlying the substrate 100 beyond of the pair neighboring trenches 101, which includes a gate 114, a gate dielectric layer 113, and a source/drain region 115. Two gates 117 are respectively disposed on the STI structure 112 over each trench 101.

FIG. 2 is a plan view of the pair of neighboring trenches before formation of the STI structure in FIG. 1. Conventionally, in order to leave a space for forming the STI structure, an island photoresist pattern is used for defining the active area AA. Due to device shrinkage, misalignment is likely to occur when aligning the active area AA to the trench 101. Consequently, process windows are narrow, and shorts between the active area AA and the trench capacitor 101 are more serious.

SUMMARY

An embodiment of the invention provides a volatile memory device and method of fabricating thereof. A collar insulating layer is defined by a mask layer to form a collar insulating layer with a high level portion and a low level portion, thus increasing the distance between conductive layers in trenches and active areas of the volatile memory device. Shorts between active areas and deep trench capacitors are eliminated.

An embodiment of a method for forming a volatile memory device comprises providing a substrate comprising a pair of neighboring trenches, each trench comprising a capacitor. A collar insulating layer is formed on upper sidewall of each trench. The collar insulating layer comprises a low level portion and a high level portion adjacent to a predetermined active area of the volatile memory device.

Also provided is a volatile memory device, comprising a substrate comprising a pair of neighboring trenches; two capacitors, each disposed in lower portions of the corresponding trenches; two conductive layers, each disposed in the corresponding trenches and overlying the capacitors, wherein the conductive layers are under the substrate surface level; and two collar insulating layers, each disposed on the upper sidewalls of corresponding trenches and surrounding the corresponding conductive layers, wherein each collar insulating layer comprises a low level portion and a high level portion adjacent to a predetermined active area of the volatile memory device.

Further provided is a volatile memory device, comprising a strip-shaped active area and a pair of trench capacitors disposed on both sides of the strip-shaped active area. Each trench capacitor comprises a conductive layer disposed on upper portion of the trench capacitor, and a collar insulating layer surrounding the conductive layer. The collar insulating layer comprises a low level portion and a high level portion adjacent to the strip-shaped active area.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION

Figure 1:
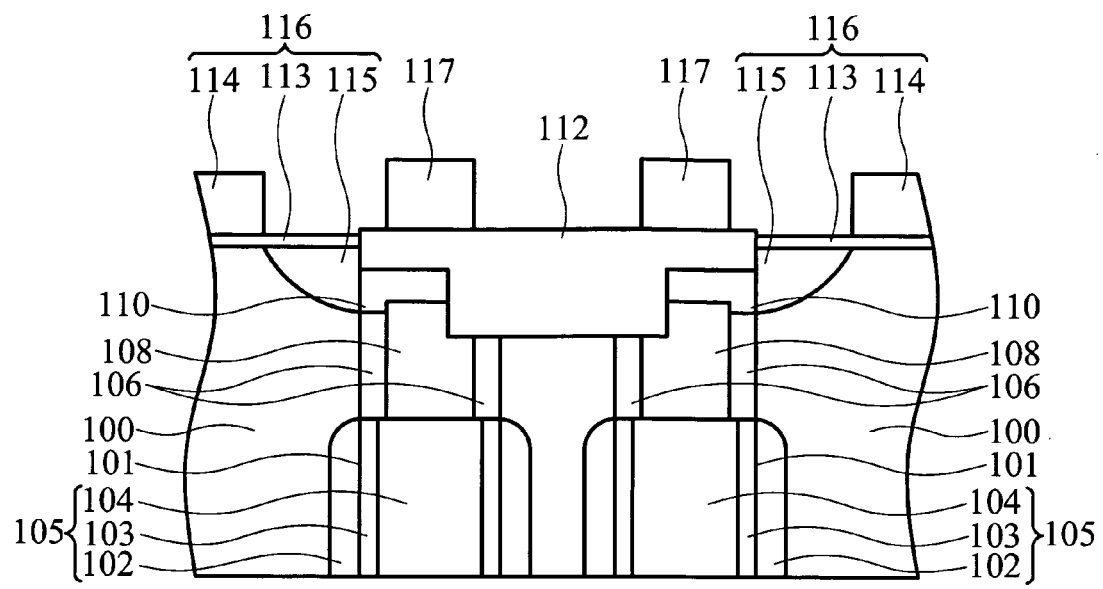
FIG. 1 is a cross-section showing a conventional deep trench-based DRAM structure.

FIGS. 3a to 3g are cross-sections showing an embodiment of a method for forming a volatile memory structure, such as a DRAM structure. First, in FIG. 3a, a substrate 200, such as a silicon wafer, is provided. A hardmask layer 203 is formed on the substrate 200. The hardmask layer 203 comprises a pad oxide layer 201, an overlying silicon nitride layer 202 and an optional oxide layer (not shown) overlying the silicon nitride layer 202. The pad oxide layer 201 can be formed by thermal oxidation or conventional chemical vapor deposition (CVD). Moreover, the silicon nitride layer 202 overlying the pad oxide layer 201 can be formed by low pressure CVD (LPCVD) using $SiCl_2H_2$ and $NH_3$ as reaction sources.

A plurality of openings is then formed in the hardmask layer 203 by lithography and etching. Anisotropic etching, such as reactive ion etching (RIE), is subsequently performed on the substrate 200 using the hardmask layer 203 as an etch mask to form a plurality of trenches therein. In order to simplify the diagram, only a pair of neighboring trenches 204 is shown.

A buried trench capacitor 208 is respectively formed in a lower portion of each trench 204. The formation of the buried trench capacitors 208 includes the following steps. First, a buried bottom plate 205 is formed in the substrate around the lower portion of the trench 204. Next, a capacitor dielectric layer 206, such as a silicon nitride/silicon oxide (NO) layer or a silicon oxide/silicon nitride/silicon oxide (ONO) layer, is conformably formed over the lower portion of the sidewall of the trench 204. Finally, a top plate 207, such as a doped polysilicon layer, is formed in the lower portion of the trench 204 and surrounded by the capacitor dielectric layer 206.

A conformal insulating layer 210, such as a silicon oxide layer, is deposited overlying the hardmask layer 203 and an upper portion of the inner surface of each trench 204 by conventional deposition, such as CVD.

Figure 3A:
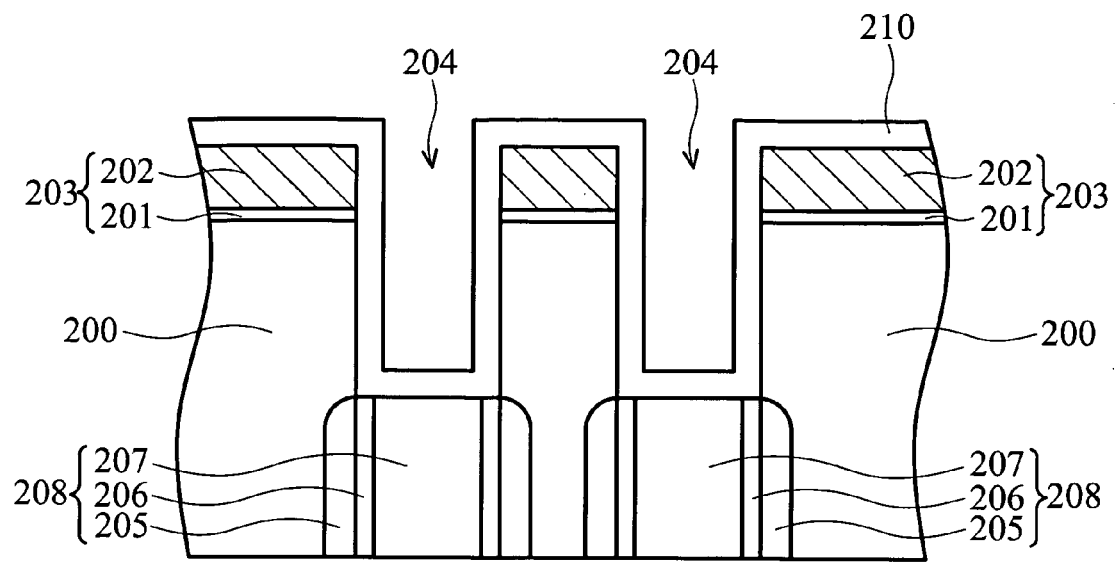
FIGS. 3a to 3g are cross-sections showing an embodiment of a method for forming a volatile memory structure.
Figure 3B:
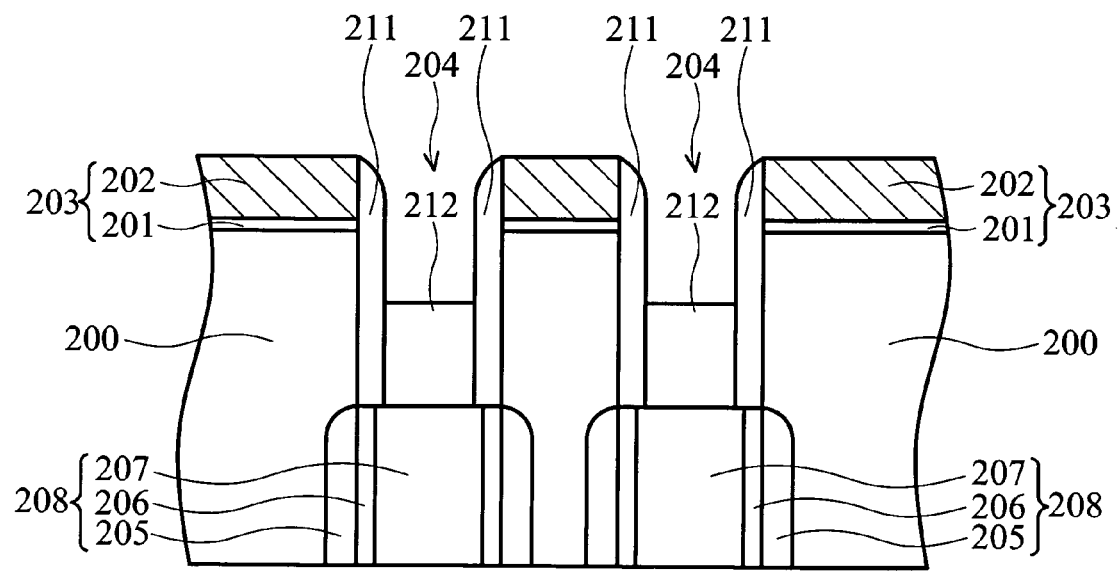

FIGS. 3b to 3e-1 are cross-sections showing an embodiment of a method for forming a collar insulating layer with a high level portion and a low level portion for a volatile memory device. In FIG. 3b, anisotropic etching, such as RIE, is performed on the insulating layer 210 to form an insulating spacer 211 over the upper portion of the sidewall of each trench 204. Next, a first conductive layer (not shown), such as a doped polysilicon layer, is formed overlying the hardmask layer 203 and fills in each trench 204. Thereafter, the first conductive layer is recessed by etching to leave a portion of the first conductive layer 212 surrounded by the insulating spacer 211 protruding from the surface of the first conductive layer 212 in each trench 204.

Figure 3C:
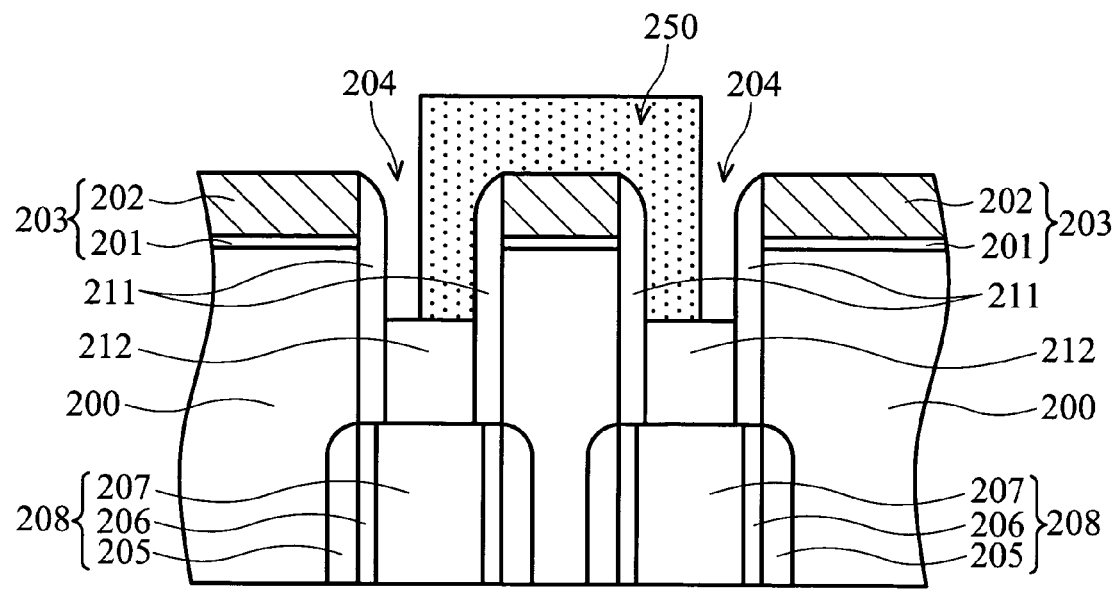
Figure 3D:
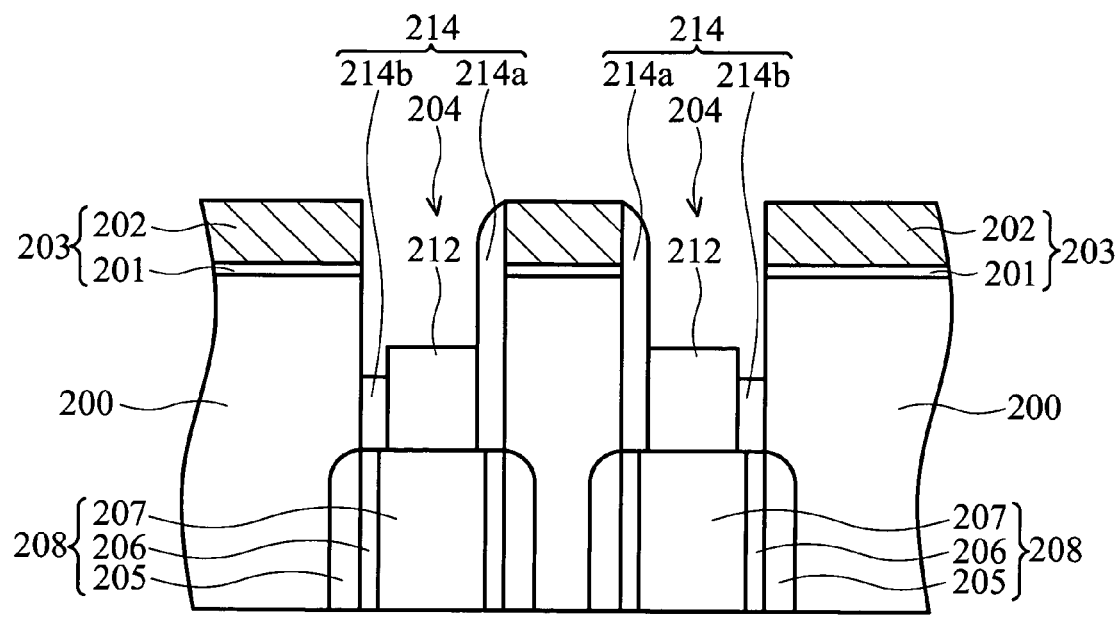
Figure 4A:
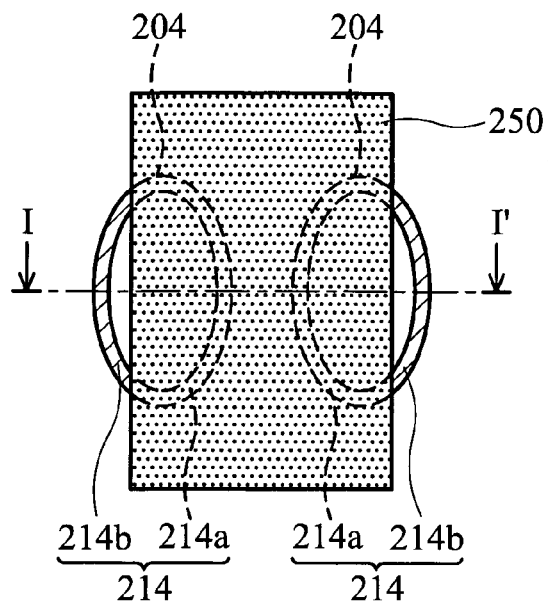
FIG. 4a is a plan view showing the step of covering portions of the insulating spacers in FIG. 3c.

Referring to the FIGS. 3c and 4a, wherein FIG. 4a is a plan view showing the step of covering portions of the insulating spacers and FIG. 3c is a cross-section along line I–I' in FIG. 4a. A masking layer 250, such as a photoresist layer, overlying the hardmask layer 203 between the neighboring trenches 204, is formed by a lithography process, covering portions of the insulating spacers 211 adjacent to a predetermined active area (not shown) of the memory device. The exposed insulating spacers 211 are subsequently removed by, for example wet chemical etching, and followed by removal of the masking layer 250, as shown in FIG. 3d. As a result, the collar insulating layer 214 with a low level portion 214b and a high level portion 214a adjacent to the predetermined active area (not shown) is formed in each trench 204 to serve as an isolation region between the buried trench capacitors 208 and a subsequently formed active area. The masking layer 250 can be a strap-shaped pattern or any other pattern, as long as about ⅔ the insulating spacer 211 in each trench 204 is covered to forming a high level portion 214a adjacent to the predetermined active area to eliminate shorts between active areas and deep trench capacitors (AA-DT Short) of a DRAM.

Figure 4B:
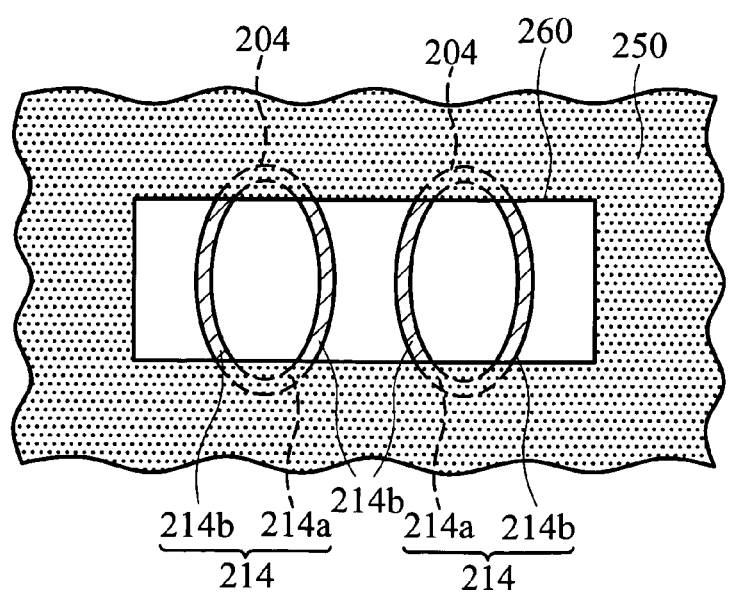
FIG. 4b is a plan view showing the step of covering portions of the insulating spacers with another pattern of mask.

As shown in FIG. 4b, a plan view showing another structure of the collar insulating layer, a mask layer 250 with a strip-shaped opening 260 covers portions of the collar insulating layers 214 adjacent to a predetermined active area (not shown). Consequently, subsequent to anisotropic etching of the collar insulating layer using the mask layer as a mask, the low level portion 214b of the collar insulating is disposed at both sides of each trench and the high level portion 214a is disposed at upper and lower sides thereof.

The collar insulating layer 214 is defined to have a low level portion 214b and a high level portion 214a adjacent the predetermined active areas. The pattern of the mask 250 is not limited, and can have any pattern covering the portion of the collar insulating layer adjacent to the predetermined active areas.

Figure 2:
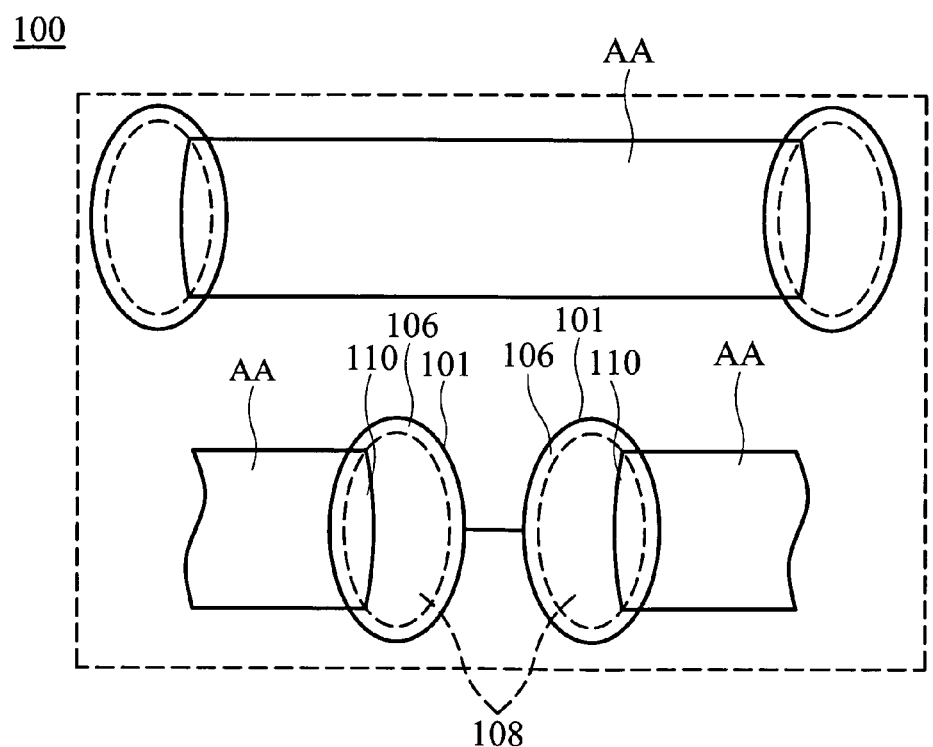
FIG. 2 is a plan view of the pair of the neighboring trenches prior to forming the STI structure of FIG. 1.
Figures 1, 3E:
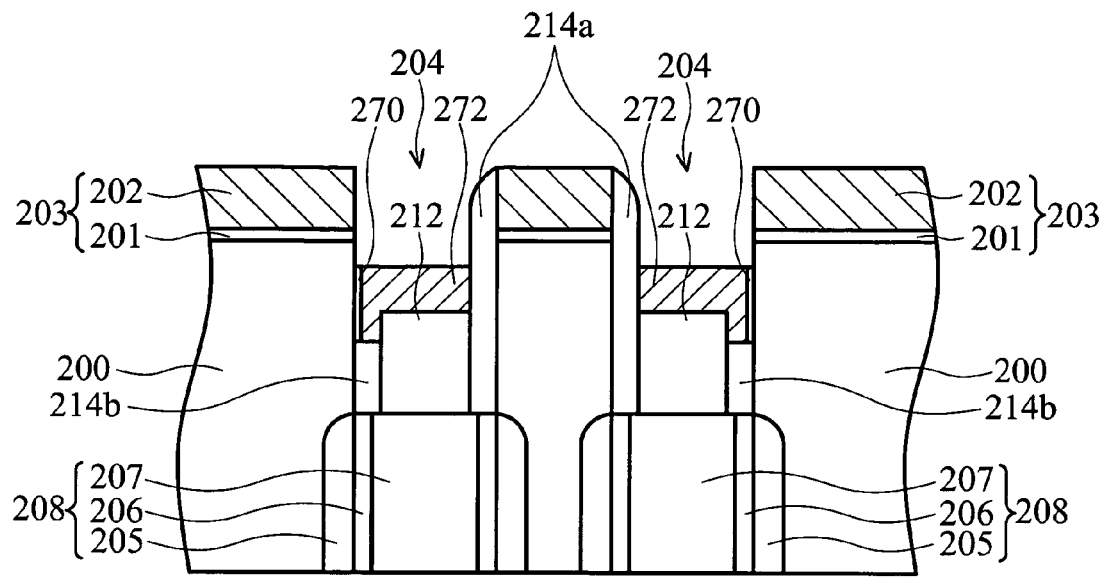
Figures 2, 3E:
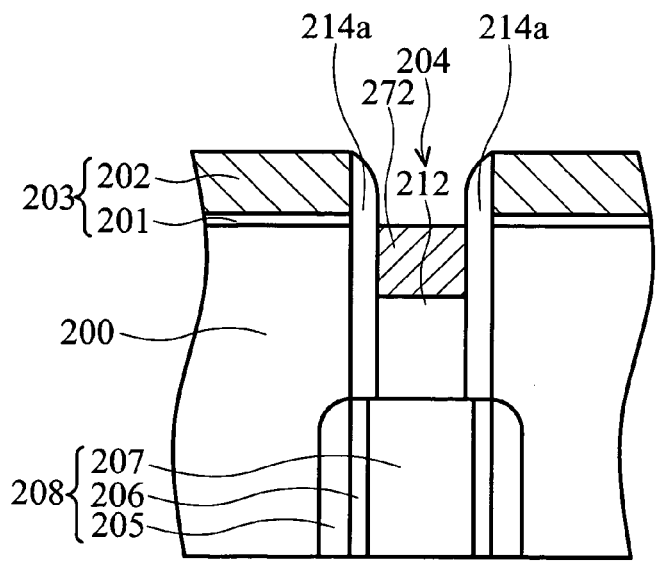
Figure 4C:
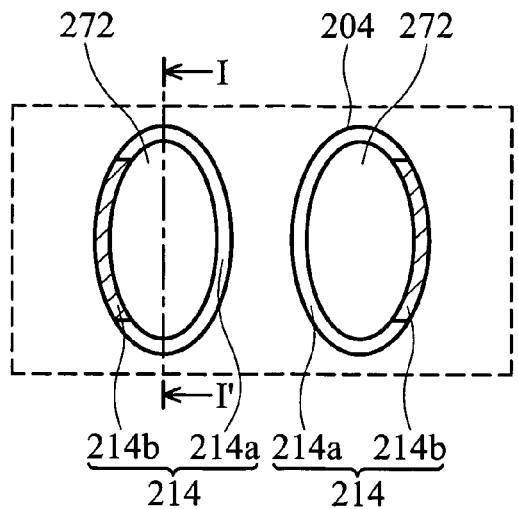
FIG. 4c is a plan view showing the step of forming a second dielectric layer in FIG. 3e-2.

In FIG. 3e-1, a buried strap isolation layer 270, such as a nitride layer, with a thickness of less than about 30 Å, is formed on the sidewall of each trench 204, for example LPCVD or nitridation, to reduce leakage current through the buried strap. A polysilicon layer is formed and then recessed to form a second conductive layer 272 overlying the first conductive layer 212. As shown in FIG. 3e-2 and FIG. 4c, wherein FIG. 3e-2 is a cross section along line I–I' of FIG. 4c, the second conductive layer 272 presents a first distance from the predetermined active area (not shown), and the trench presents a second distance from the predetermined active area (not shown), in which the second distance is shorter than the first distance by about a gap, substantially the same as thickness of the collar insulating layer 214.

Figure 3F:
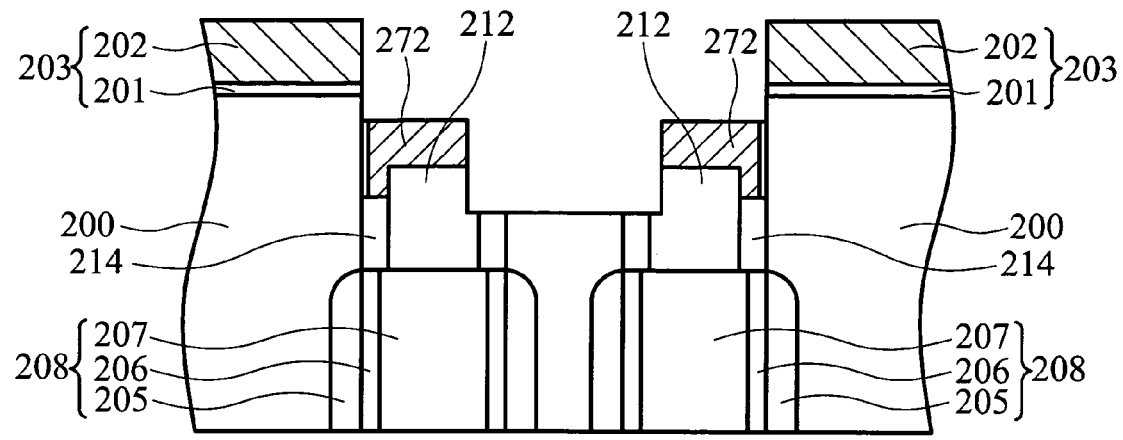
Figure 3G:
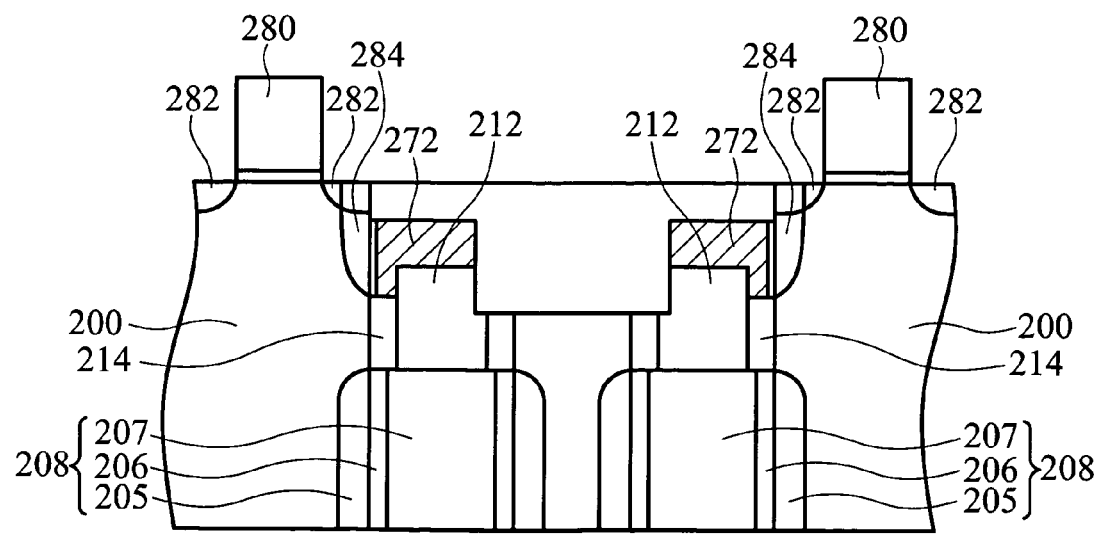
Figure 4D:
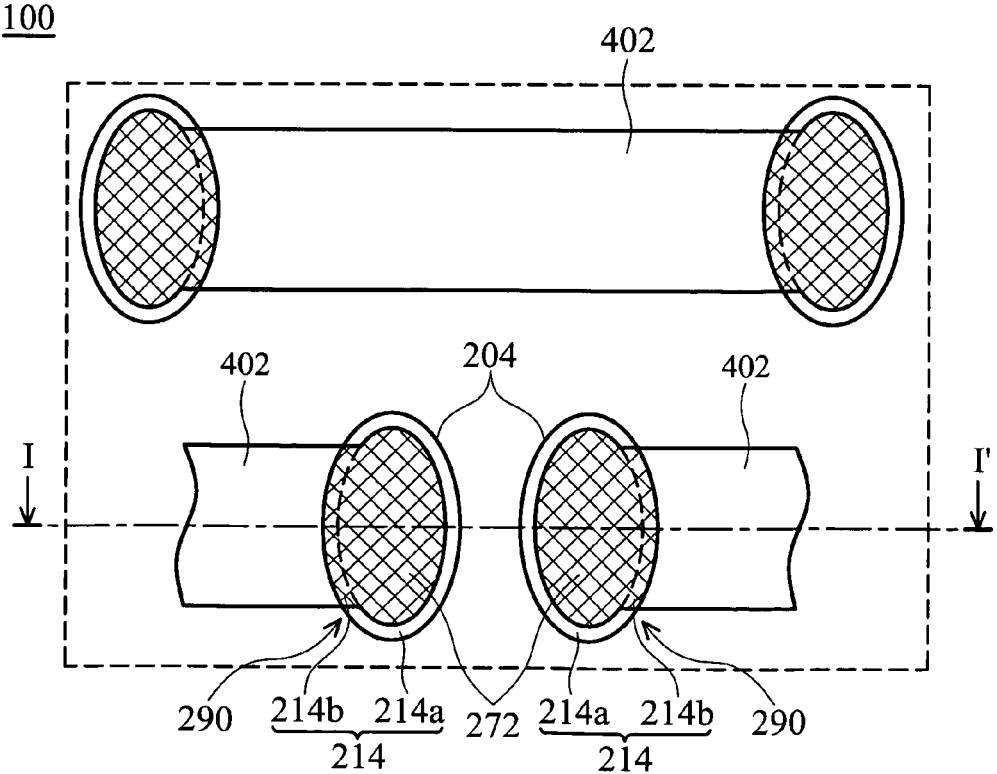
FIG. 4d is a plan view showing the step of defining the active area in FIG. 3f.

Next, referring to FIG. 3f and FIG. 4d, wherein FIG. 3f is a cross section along line I–I' of FIG. 4d, a strip-shaped active area mask layer (not shown) is formed and an etching step is performed to define an active area 402 using the resistor layer as a mask. In FIG. 3g, an embodiment of a method for forming volatile memory devices further comprises forming gates 280 on the active areas, and forming source/drain regions 282 in the active areas by ion implantation to form two transistors adjacent to the pair of trenches respectively. The trench capacitor is electrically connected to the source/drain region 282 of the transistor through second conductive layer 272 and the buried strap 284 over the low level portions of the collar insulating layers 214.

FIG. 4d shows a memory structure subsequent to formation of active areas. In FIG. 4d, a strip-shaped active area 402 is disposed on a substrate wit a pair of trench capacitors 290 on both sides. Each trench capacitor 290 comprises a conductive layer 272 on an upper portion of the trench capacitor 290 and a collar insulating layer 214 surrounding the conductive layer 272. The collar insulating layer 214 has a low level portion 214b and a high level portion 214a adjacent to the active area 402. The conductive layer 272 has a first distance from the active area 402, and the trench 204 has a second distance from the active area 402 less than the first distance by about a gap, substantially the same as thickness of the collar insulating layer 214.

Due to the high level portion of the collar insulating layer, the second conductive layer shrinks to increase the distance between the second conductive layer and the active area. Process window for alignment between the active area and the trench capacitor may thus be increased, potentially eliminating AA-DT shorts.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a volatile memory device, comprising:
   providing a substrate comprising a pair of neighboring trenches, each comprising a capacitor; and
   forming a collar insulating layer on an upper sidewall of each trench, wherein the collar insulating layer comprises a low level portion and a high level portion wherein the high level portion is adjacent to a predetermined active area of the volatile memory device, wherein the step of forming the collar insulating layer comprises:
   forming an insulating layer on the sidewall of the trench overlying the capacitor;
   forming a first conductive layer overlying the capacitor, wherein the first conductive layer is surrounded by the insulating layer;
   using a mask layer to cover a portion of the insulating layer adjacent to the predetermined active area;
   etching the uncovered insulating layer; and
   removing the mask layer.

2. The method as claimed in claim 1, further comprising:
   forming a second conductive layer on the first conductive layer in each trench;
   forming a strip-shaped active area mask layer overlying the substrate and covering portion of each trench;
   etching the substrate using the active area mask layer as a mask to form an active area.

3. The method as claimed in claim 2, wherein the second conductive layer has a first distance from the predetermined active area, the trench has a second distance from the predetermined active area wherein the second distance is shorter than the first distance by about a gap, and the gap is substantially the same as thickness of the collar insulating layer.

4. The method as claimed in claim 2, wherein the first conductive layer and the second conductive layer are doped polysilicon.

5. The method as claimed in claim 1, wherein the collar insulating layer comprises silicon oxide.

* * * * *